(12) United States Patent
Choi et al.

(10) Patent No.: US 9,558,009 B1
(45) Date of Patent: Jan. 31, 2017

(54) EXPEDITED FIND SECTOR TO DECREASE BOOT TIME

(71) Applicant: SanDisk Technologies Inc., Plano, TX (US)

(72) Inventors: Injae Choi, Kyonggi-do (KR); Hyung-Bae Park, Yongin-si (KR)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/851,529

(22) Filed: Sep. 11, 2015

(51) Int. Cl.
*G06F 9/44* (2006.01)
*G06F 9/46* (2006.01)
*G06F 3/06* (2006.01)
*G06F 9/445* (2006.01)
*G11C 7/20* (2006.01)

(52) U.S. Cl.
CPC .......... *G06F 9/4403* (2013.01); *G06F 3/0632* (2013.01); *G06F 9/4401* (2013.01); *G06F 9/445* (2013.01); *G06F 9/467* (2013.01); *G11C 7/20* (2013.01)

(58) Field of Classification Search
CPC ...... G06F 9/4401; G06F 9/4403; G06F 9/445; G06F 9/467; G06F 3/0632; G06F 3/0679; G11C 7/20
See application file for complete search history.

(56) References Cited

U.S. PATENT DOCUMENTS

| | | | | |
|---|---|---|---|---|
| 2009/0172252 | A1* | 7/2009 | Tomlin | G06F 8/665 |
| | | | | 711/103 |
| 2013/0185487 | A1* | 7/2013 | Kim | G06F 3/0605 |
| | | | | 711/103 |
| 2015/0317083 | A1* | 11/2015 | Phan | G06F 3/0608 |
| | | | | 711/103 |

OTHER PUBLICATIONS

Boot Sector, dated Aug. 13, 2015, pp. 1-4, Wikipedia, available at https://en.wikipedia.org/wiki/boot_sector.
Booting, dated Sep. 8, 2015, pp. 1-15, Wikipedia, available at https://en.wikipedia.org/wiki/booting.

* cited by examiner

*Primary Examiner* — Dennis M Butler
(74) *Attorney, Agent, or Firm* — Brinks Gilson & Lione

(57) ABSTRACT

A system may be provided that includes a random access memory, a non-volatile solid state memory, a serial non-volatile semiconductor memory, and a memory controller. The non-volatile solid state memory may include a boot block and a code partition. The serial non-volatile semiconductor memory stores a last written boot sector identifier. The memory controller may be configured to read the last written boot sector identifier from the serial non-volatile semiconductor memory and find a last written boot sector of the boot block based on the last written boot sector identifier read from the serial non-volatile semiconductor memory.

15 Claims, 3 Drawing Sheets

EXPEDITED FIND SECTOR TO DECREASE BOOT TIME

TECHNICAL FIELD

This disclosure relates to non-volatile solid state memory devices and, in particular, to booting non-volatile solid state memory devices.

BACKGROUND

When booting a non-volatile solid state memory device, such as a flash drive, a boot loader may load and initialize firmware that implements a block storage protocol, such as SATA or ATA. The firmware may be stored in the non-volatile solid state memory of the device. In order to initialize and/or load the firmware, the boot loader may read parameters from the non-volatile solid state memory of the device.

The parameters may vary over time. As a result, the parameters may be written to the non-volatile solid state memory of the device when the device is being shut down, for example. Accordingly, when the boot loader reads the parameters from the non-volatile solid state memory, the parameters should have the correct values.

To increase the endurance of the non-volatile solid state memory, the parameters may be written to a new location, such as a new sector, in the non-volatile solid state memory each time the parameters are written. When booting the device, the boot loader may search sectors in a block of the non-volatile solid state memory for a sector in which one or more of the parameters are stored.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Overview

Figure 1A:
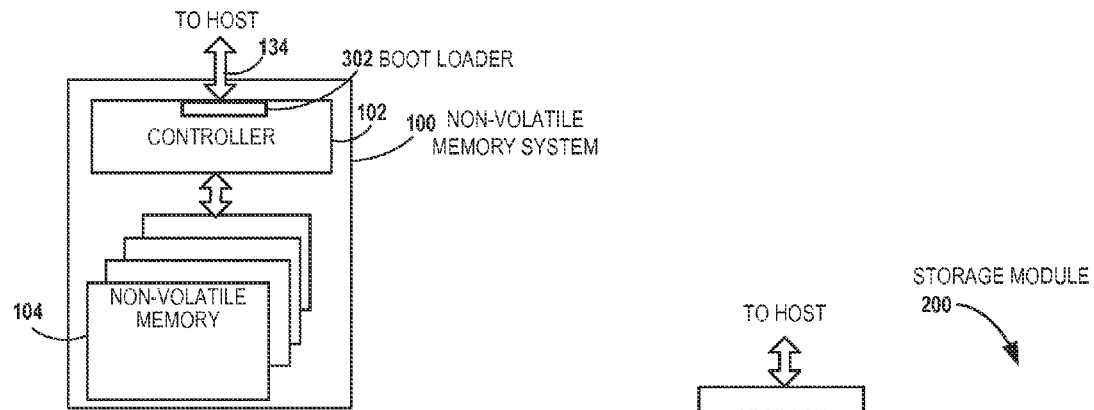
FIG. 1A is a block diagram of a non-volatile memory system of an embodiment.

By way of introduction, in one embodiment, a non-volatile memory system may be provided with a random access memory, a non-volatile solid state memory, a serial non-volatile semiconductor memory, and a memory controller. The non-volatile solid state memory may include a boot block and a code partition. The serial non-volatile semiconductor memory stores a last written boot sector identifier. The memory controller may be configured to: read the last written boot sector identifier from the serial non-volatile semiconductor memory; find a last written boot sector of the boot block based on the last written boot sector identifier read from the serial non-volatile semiconductor memory; find a last written sector of the code partition based on information read from the last written boot sector; and load firmware from the last written sector of the code partition into the random access memory, the firmware executable to implement at least a portion of a block storage protocol.

In another embodiment, a method for booting a non-volatile memory system is provided. A last written boot sector identifier may be read from a serial non-volatile semiconductor memory. A last written boot sector of a boot block may be found in a non-volatile solid state memory based on the last written boot sector identifier read from the serial non-volatile semiconductor memory. A last written sector of a code partition of the non-volatile solid state memory may be found based on information read from the last written boot sector. Firmware stored in the last written sector of the code partition may be loaded, where the firmware is executable to enable communication between the non-volatile memory system and a host.

In yet another embodiment, a computer readable storage medium may be provided that includes computer executable instructions executable by a processor. The computer executable instructions may include: instructions executable to read a last written service sector identifier from a serial non-volatile semiconductor memory, the serial non-volatile semiconductor memory and a non-volatile solid state memory included in a storage device; instructions executable to find a last written service sector of a service partition of the non-volatile solid state memory based on the last written service sector identifier read from the serial non-volatile semiconductor memory; and instructions executable to execute firmware that implements at least a portion of a block storage protocol and reads a block storage protocol interface parameter from the last written service sector.

Other embodiments are possible, and each of the embodiments may be used alone or together in combination. Accordingly, various embodiments will now be described with reference to the attached drawings.

Exemplary Embodiments

As explained in the background section, when booting a non-volatile solid state memory device, a boot loader may search sectors of a block of the non-volatile solid state memory for a sector in which one or more parameters are stored. For example, the boot loader may conduct a binary search to find a last written boot sector in a boot block, where the last written boot sector may store desired parameters. However, the binary search may consume more time than is desired for a boot process.

To address the technical problem of a potentially time consuming search during a boot of the memory device, the memory device may include a serial non-volatile memory that stores one or more parameters. The serial non-volatile memory may be, for example, serial flash memory. The serial non-volatile memory may be memory that includes a serial interface, such as Serial Peripheral Interface Bus (SPI), for sequential data access. The serial non-volatile memory may transmit and receive data one bit at a time. The parameter or parameters stored in the serial non-volatile memory may identify a location of the last written sector of one or more blocks. The boot loader may read the one or more parameters from the serial non-volatile memory and then find the last written sector of one or more blocks based on the location identified by the one or more parameters. Accordingly, searching through the sectors for the last written sector may be avoided when the parameter or parameters in the serial non-volatile memory are up to date.

Figure 1B:
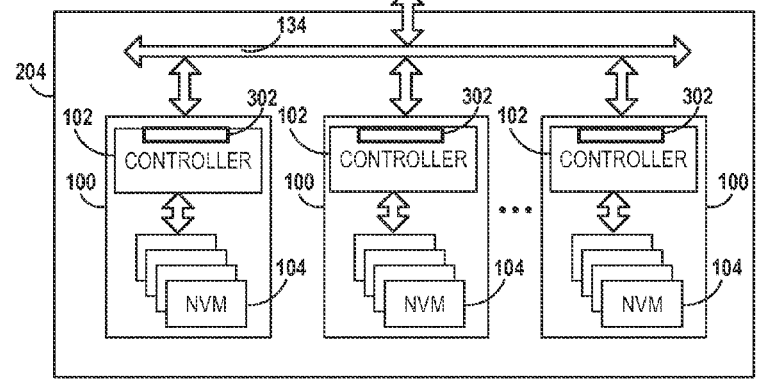
FIG. 1B is a block diagram illustrating an exemplary storage module of an embodiment.
Figure 1C:
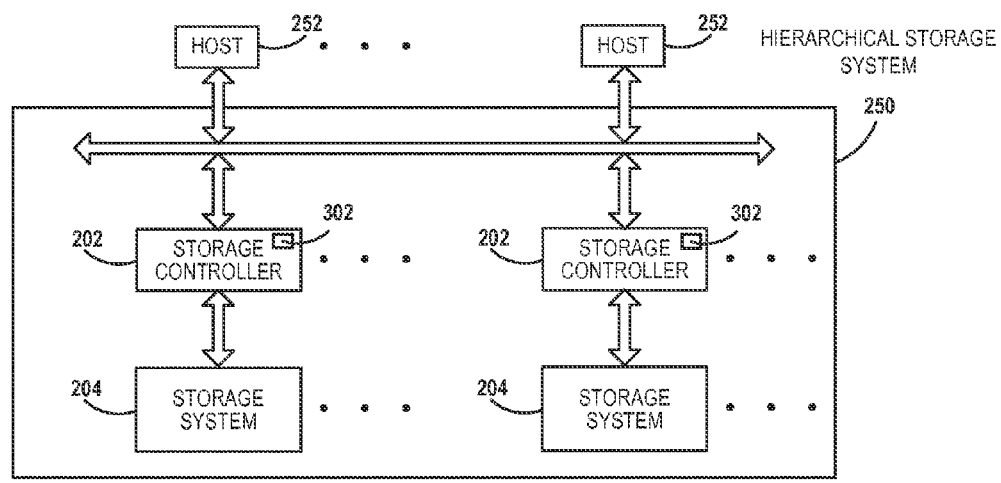
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, the non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. The controller 102 interfaces with a host system and transmits command sequences for read, program, and erase operations to the non-volatile memory die 104. Examples of the host system may include, for example, a mobile phone, a tablet computer, a digital media player, a game device, a personal digital assistant (PDA), a mobile (for example, notebook, laptop) personal computer (PC), a book reader, or any other processing device.

The controller 102, which may be a flash memory controller or any other memory controller, may be in the form of processing circuitry, such as a microprocessor or a processor, and a computer-readable medium that stores computer-readable program code (for example, firmware) executable by the processing circuitry. The controller 102 may include a (micro)processor, logic gates, switches, an application specific integrated circuit (ASIC), a programmable logic controller, and/or an embedded microcontroller, for example. The controller 102 may be configured with hardware and/or firmware to perform the various functions described below and shown in the flow diagrams. The controller 102 may include a boot loader 302. Alternatively or in addition, some of the components, such as the boot loader 302, which is shown as being internal to the controller 102, may be external to the controller.

As used herein, a flash memory controller may be a device that manages data stored on flash memory and communicates with the host system (alternatively referred to herein as a host or a host device), such as a computer or electronic device. A flash memory controller may have functionality in addition to the specific functionality described herein. For example, the flash memory controller may format the flash memory to ensure the memory is operating properly, map out bad flash memory cells, and allocate spare cells to be substituted for future failed cells. Some part of the spare cells may be used to hold firmware to operate the flash memory controller and implement other features. In operation, when a host needs to read data from or write data to the flash memory, the host will communicate with the flash memory controller. If the host provides a logical address to which data is to be read and/or written, the flash memory controller may convert the logical address received from the host to a physical address in the flash memory. (Alternatively, the host may provide the physical address.) The flash memory controller may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block may be erased and reused).

The non-volatile memory die 104 may include any suitable non-volatile storage medium, including NAND flash memory cells and/or NOR flash memory cells. The memory cells may take the form of solid-state (such as flash) memory cells and may be one-time programmable, few-time programmable, or many-time programmable. The memory cells may also be single-level cells (SLC), multiple-level cells (MLC), triple-level cells (TLC), or use other memory cell level technologies, now known or later developed. Also, the memory cells may be fabricated in a two-dimensional or three-dimensional fashion.

The interface between controller 102 and non-volatile memory die 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the memory system 100 may be part of an embedded memory system.

Although, in the example illustrated in FIG. 1A, the non-volatile memory system 100 (alternatively referred to herein as a storage module) includes a single channel between the controller 102 and the non-volatile memory die 104, the subject matter described herein is not limited to having a single memory channel. For example, in some NAND memory system architectures like the ones in FIGS. 1B, 1C, and 2, more NAND channels may exist between the controller 102 and the non-volatile memory die 104, depending on controller capabilities. In any of the embodiments described herein, more than a single channel may exist between the controller 102 and the memory die 104, even if a single channel is shown in the drawings.

The controller 102 may be operatively in communication with the host system over a bus 134. The phrase "operatively in communication with" may mean directly in communication with or indirectly (wired or wireless) in communication with through one or more components, which may or may not be shown or described herein.

The bus 134 may be a system that transfers data between components, such as between the controller 102 and a host. In some examples, the bus 134 may include related hardware components, such as wire and/or optical fiber, and software. The bus 134 may include parallel electrical wires over which electronic signals propagate. Examples of the bus 134 may include, an Ultra High Speed (UHS) bus, an Ultra High Speed, Phase I (UHS-I) bus, an Ultra High Speed, Phase II (UHS-II) bus, a Secure Digital (SD) bus, a Secure Digital High Capacity (SDHC) bus, a Secure Digital eXtended Capacity (SDXC) bus, a Universal Serial Bus (USB), a serial advanced technology attachment (SATA) bus, a peripheral component interface express (PCIe) bus, or any other type of bus.

FIG. 1B illustrates a storage module 200 that includes multiple non-volatile memory systems 100. As such, the storage module 200 may include a storage controller 202 that interfaces with a host and with storage system 204, which includes multiple non-volatile memory systems 100. The multiple non-volatile memory systems 100 may be operably in communication with the storage module 200 over the bus 134. The interface between the storage controller 202 and non-volatile memory systems 100 may be a bus interface, such as a serial advanced technology attachment (SATA) or peripheral component interface express (PCIe) interface. The storage module 200, in one embodiment, may be configured as a solid state drive (SSD), which may be configured in portable computing devices, such as laptop computers, and tablet computers.

As illustrated in FIG. 1B, each of the controllers 102 of the non-volatile memory systems 100 may include the boot loader 302. Alternatively or in addition, the storage controller 202 that interfaces with the host may include the boot loader 302.

FIG. 1C is a block diagram illustrating a hierarchical storage system 250. The hierarchical storage system 250 may include multiple storage controllers 202, each of which controls a respective storage system 204. Host systems 252 may access memories within the storage system 250 via a bus interface. In one embodiment, the bus interface may be an NVMe or fiber channel over Ethernet (FCoE) interface. In one embodiment, the system 250 illustrated in FIG. 1C may be a rack mountable mass storage system that is accessible by multiple host computers, such as would be found in a data center or other location where mass storage is needed.

Each of the storage controllers 202 may include a corresponding boot loader 302. Alternatively or in addition, each respective storage system 204 may include one or more corresponding boot loaders as shown in FIG. 1B.

Figure 2:
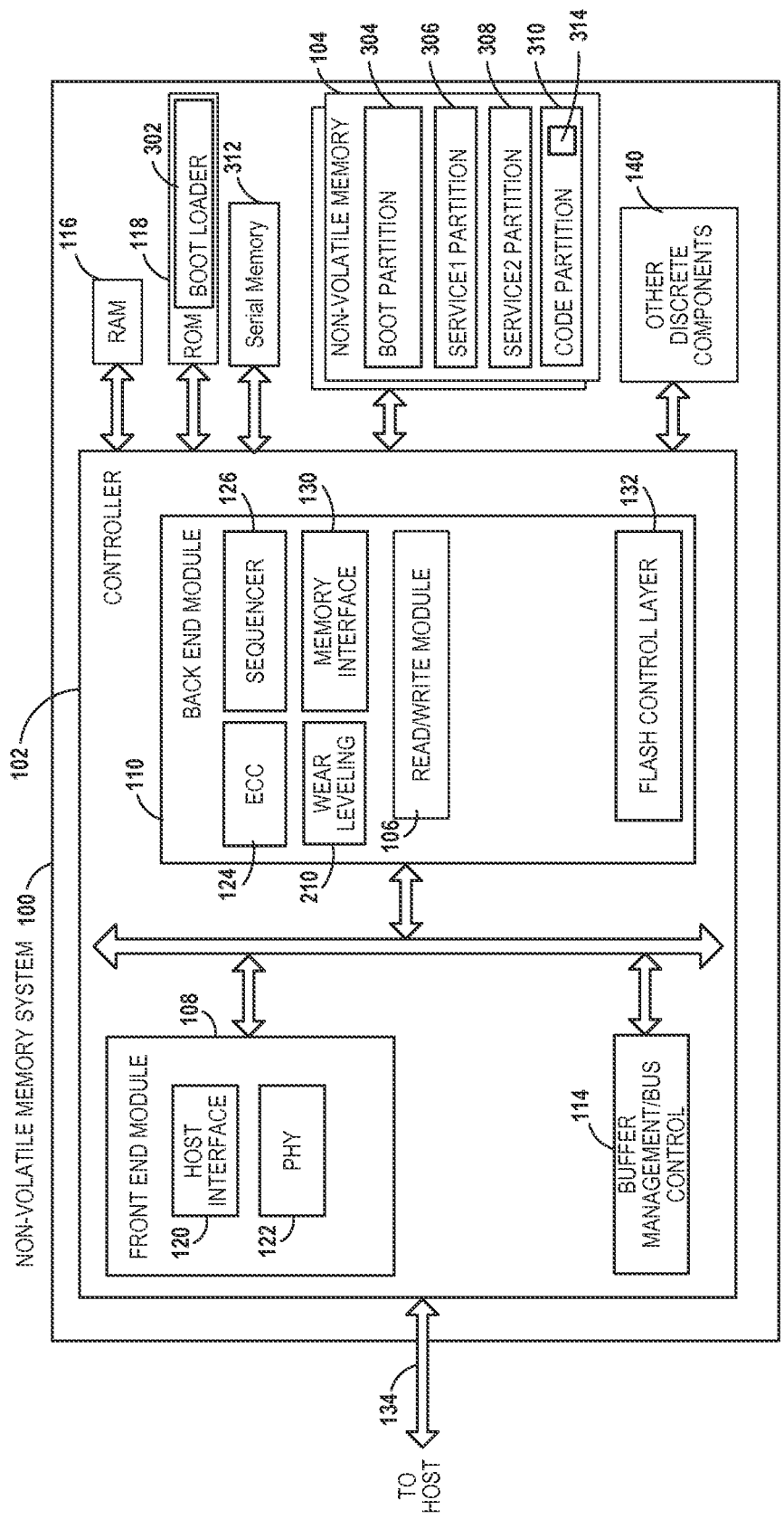
FIG. 2 is a block diagram illustrating exemplary components of the controller of the non-volatile memory system illustrated in FIG. 1A according to an embodiment.

FIG. 2 is a block diagram illustrating exemplary components of controller 102 in more detail. The controller 102 may include a front end module 108 that interfaces with a host over the bus 134, a back end module 110 that interfaces with the one or more non-volatile memory die 104, and various other modules that perform functions which will now be described in detail.

Modules of the controller 102 may include the boot loader 302. Another module of the controller 102 may be a buffer manager/bus controller 114 that manages buffers in random access memory (RAM) 116 and controls the internal bus arbitration of the controller 102. A read only memory (ROM) 118, such as E2PROM, may include the boot loader 302. A serial memory 312 may include some information read by the boot loader 302. The serial memory 312 may be a serial non-volatile memory that stores one or more of the parameters. The serial non-volatile memory such as serial flash memory. The serial non-volatile memory may be memory that includes a serial interface, such as Serial Peripheral Interface Bus (SPI), for sequential data access. The serial memory 312 may transmit and receive data one bit at a time. Although illustrated in FIG. 2 as located separately from the controller 102, in other embodiments one or more of the RAM 116, ROM 118, and serial memory 312 may be located within the controller 102. In yet other embodiments, portions of RAM, ROM and serial memory 312 may be located both within the controller 102 and outside the controller 102.

The front end module 108 may include a host interface 120 and a physical layer interface (PHY) 122 that provide the electrical interface with the host or next level storage controller. The choice of the type of host interface 120 may depend on the type of memory being used. Examples of the host interface 120 include, but are not limited to, SATA, SATA Express, SAS, Fibre Channel, USB, PCIe, and NVMe. The host interface 120 typically facilitates transfer for data, control signals, and timing signals.

The back end module 110 may include modules such as a wear leveling module 210, an error correction controller (ECC) engine 124, a command sequencer 126, a memory interface 130, and a flash control layer 132. The ECC engine 124 may encode the data bytes received from the host, and decode and error correct the data bytes read from the non-volatile memory, which includes the non-volatile memory die 104. The command sequencer 126 may generate command sequences, such as program and erase command sequences, to be transmitted to the non-volatile memory die 104. The memory interface 130 provides the command sequences to the non-volatile memory die 104 and receives status information from the non-volatile memory die 104. In one embodiment, the memory interface 130 may be a double data rate (DDR) interface, such as a Toggle Mode 200, 400, or 800 interface. The flash control layer 132 may control the overall operation of the back end module 110. The wear leveling module 210 may arrange data so that erasures and re-writes are distributed more evenly across the non-volatile memory than without wear leveling. By distributing the erasures and re-writes, the wear leveling module 210 may limit the possibility that a single erase block prematurely fails due to a high concentration of write cycles.

The non-volatile memory system 100 may include other discrete components 140, such as external electrical interfaces, external RAM, resistors, capacitors, or other components that may interface with the controller 102. In alternative embodiments, one or more of the physical layer interface 122 and buffer management/bus controller 114 are optional components that are not necessarily included in the controller 102.

The non-volatile memory die 104 may include one or more blocks of data read by the boot loader 302. For example, the non-volatile memory die 104 may include a boot partition 304, a service1 partition 306, a service2 partition 308, and a code partition 310. Each of the partitions 304, 306, 308 and 310 may be a block or a unit of erase. Accordingly, the boot partition 304, the service1 partition 306, the service2 partition 308, and the code partition 310 may alternatively be referred to as the boot block 304, the service1 block 306, the service2 block 308, and the code block 310. Each partition or block may include multiple sectors. Each sector may be a page, for example, which is a unit of read and/or a unit of write.

The boot partition 304 may include basic information to initialize firmware 314 during a boot of the non-volatile memory system 100. The basic information may be limited to information that changes infrequently enough to avoid endurance issues in the boot partition 304.

The service partitions 306 and 308 may include information used by the firmware 314. The service1 partition 306 may include information that changes more frequently than the service 2 partition 308. For example, the service1 partition 306 may include SATA related information and log files. The service2 partition 308 may include ATA related information. The code partition 310 may include executable code such as the firmware 314.

During a boot of the system 100, the system 100 may transition from an inactive state to a state in which the system 100 may communicate with the host over the bus 134. The boot or booting of the system 100 may occur when the system 100 is powered up. The host may supply the power to the system 100 or the system 100 may receive power from some other source. The host may, in some configurations, selectively power down or power up peripherals or subsystems, such as the non-volatile memory system 100. For example, unused peripherals may be powered down to conserve energy. In one such example, the non-volatile memory system 100 may be a SATA device that support Runtime D3 (RTD3), which powers down the system 100. The system 100 may boot when power is restored to the system 100.

When booting the system 100, the controller 102 or other processor may execute the boot loader 302 in the ROM 118. The boot loader 302 may be a bootstrap loader that loads the firmware 314 into the RAM 116 or into another memory of the controller 102. The boot loader 302 may pass execution to the firmware 314. The firmware 314, when executed, may perform the features of one or more modules, such as the host interface 120 or any other module of the controller 102. The firmware 314 may be executable to handle communication of user data between the non-volatile memory system 100 and the host. For example, the firmware 314 may be executable to implement at least a portion of a block storage protocol. Prior to executing the firmware 314, the host may not be able to write or read user data in the non-volatile memory system 100.

The block storage protocol may be any communications protocol in which data may be read in logical data blocks. The logical data blocks may be addressed by logical block addresses. A file system typically converts a file read or file write into corresponding reads or writes of logical data blocks. The logical data blocks may be units of fixed size. Examples of the block storage protocol may include Serial AT Attachment (SATA), Small Computer System Interface (SCSI), Secure Digital (SD), or any other block storage protocol.

During a boot, the boot loader 302 may start by reading one or more non-volatile parameters from the serial memory 312. The non-volatile parameters may include any data that the boot loader 302 may rely on, such as sector information. Sector information may identify a sector and include an identifier of a block, a die, a channel, a chip, and/or a page. One such non-volatile parameter may include a last written boot sector identifier. The boot loader 302 may read the last written boot sector identifier from the serial memory 312.

The boot loader 302 may find a sector based on the sector information read from the serial memory 312. For example, the boot loader 302 may find a last written boot sector of the boot block 304 in the non-volatile solid state memory 104 based on the last written boot sector identifier read from the serial memory 312. The last written boot sector identifier may identify a physical location (die, chip, and/or page) of the boot sector that is the most recent of the boot sectors in the boot partition 304 to have been written. That is, a last written sector may be the most recently written sector in a block.

The boot loader 302 may read information from the last written boot sector. In one example, the information may include an identifier of a last written sector of the code partition 310. The last written sector of the code partition 310 may include, for example, a latest version of the firmware 314.

The boot loader 302 may find the last written sector of the code partition 310 based on information read from the last written boot sector, such as the identifier of the last written sector of the code partition 310. The boot loader may direct the controller 102 to execute the firmware 314 stored the last written sector of the code partition 310. The boot loader 302 may read information from the service partitions 306 and 308 to appropriately initialize the firmware 314. Alternatively or in addition, the firmware 314 may read or write to the service partitions 306 and 308 when the firmware 314 executes.

In response to a power down signal, the firmware 314 or some other module may store the last written boot sector identifier, and/or any other non-volatile parameter that may have been updated, in the serial memory 312. Alternatively or in addition, the firmware 314 or some other module may store a non-volatile parameter that may have been updated in the serial memory 312 in response to an event other than a power down signal. In one example, the power down signal may indicate that the system 100 is to enter Runtime D3 (RTD3), a power down state identified by the SATA protocol.

Figure 3:
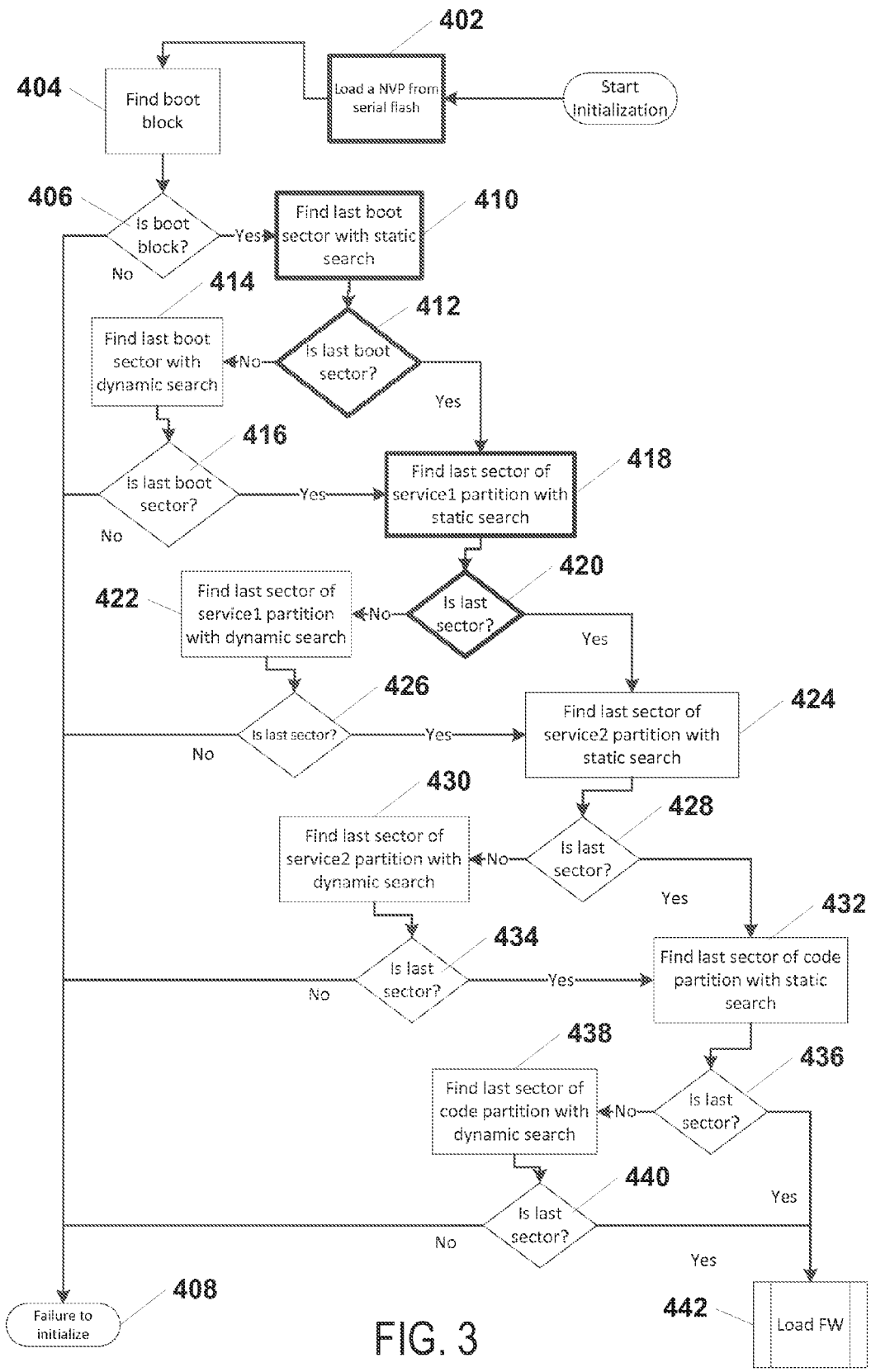
FIG. 3 illustrates a flow diagram of example logic of the boot loader 302 to initialize the non-volatile memory system.

FIG. 3 illustrates a flow diagram of example logic of the boot loader 302 to initialize the non-volatile memory system 100. The logic of the boot loader may include fewer, additional, or different operations than illustrated in FIG. 3. The operations may be performed in a different order than illustrated.

Operations may begin in an operation in which one or more non-volatile parameters are loaded (402) from the serial memory 312. The non-volatile parameters may be last written sector identifiers such as the last written boot sector identifier and a last written service1 sector identifier.

The boot block 304 may be found (404) in the non-volatile memory 104. A determination (406) may be made whether the boot block 304 found is a proper boot block. If not, then operations may end in a failure (408) of the system 100 to initialize. Alternatively, if the boot block 304 is proper, then the last written boot sector may be found in the boot block 304 based on the last written boot sector identifier.

In other words, the block in the boot partition 304 identified by the last written boot sector identifier may be found (410) by reading from a memory location identified by the last written boot sector identifier. Finding and/or reading from a memory location identified by a sector identifier may be referred to herein as a static search. A determination (412) may be made whether the sector at the memory location is the last written boot sector. If not, then the last written boot sector may be found (414) through a dynamic search of the boot partition 304. A dynamic search may be referred to herein as a search performed based on a binary search algorithm, a linear search algorithm, or any other search algorithm. The sector found in the dynamic search may be checked (416) to see if the sector is the last written sector. If the dynamic search fails to find the last written boot sector, then operations may end in a failure (408) of the system 100 to initialize.

Alternatively, if the last written boot sector is found by either a static or dynamic search, then operations may proceed to an operation in which a last sector of the service1 partition 306 is found (418) by reading from a memory location identified by the last written service1 sector identifier. A determination (420) may be made whether the identified sector is the last written service1 sector. If not, then the last written sector of the service1 partition 306 may be found (422) through a dynamic search. The sector found in the dynamic search may be checked (426) to see if the sector is the last written sector. If the dynamic search fails to find the last written service1 sector, then operations may end in a failure (408) of the system 100 to initialize.

Alternatively, if the last written sector of the service1 partition 306 is found by either a static or dynamic search, operations may continue in an operation to find (424) a last written sector of the service2 partition 308 by reading a memory location identified by a last written service2 sector identifier. The last written service2 sector identifier may have been read from the last written boot sector. Alternatively, the last written service2 sector identifier may have been read from the serial memory 312 or some other location. If the sector identified by the last written service2 sector identifier is determined (428) not to be the last written sector in the service2 partition 308, then the last sector of the service2 partition 308 may be found (430) with a dynamic search. The sector found in the dynamic search may be checked (434) to see if the sector is the last written sector. If the dynamic search fails to find the last written service2 sector, then operations may end in a failure (408) of the system 100 to initialize.

Alternatively, if the last written sector of the service2 partition 308 is found by either a static or dynamic search, operations may continue in an operation to find (432) a last written sector of the code partition 310 by reading from a memory location identified by a last written code sector identifier. The last written code sector identifier may have been read from the serial memory 312, the last written service2 sector, the last written boot sector, or some other location. If the sector identified by the last written code sector identifier is determined (436) not to be the last written sector in the code partition 310, then the last sector of the code partition 310 may be found (438) with a dynamic search. The sector found in the dynamic search may be checked (440) to see if the sector is the last written sector. If the dynamic search fails to find the last written code sector, then operations may end in a failure (408) of the system 100 to initialize.

Alternatively, if the last written sector of the code partition 310 is found by either a static or dynamic search, then the firmware 314 may be loaded (442) into the RAM 116 or other memory of the controller 102.

The system 100 may be implemented in many different ways. Each module, such as the wear leveling module 210 and the ECC engine 124, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of RAM or ROM, for example, that comprises instructions executable with a processor such as the controller 102 or other processor to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

Logic implemented as computer executable instructions or as data structures in memory may be stored in a computer readable storage medium. Such logic may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library.

The non-volatile memory system 100 may include a memory device. The memory device may be in any form that includes the non-volatile memory 300. For example, the memory device may be in the form of a memory card for solid-state storage, such as MultiMediaCard (MMC), embedded card (eMMC), Secure Digital (SD), RS-MMC, MMCplus, MMCmobile, SecureMMC, SDIO SD, miniSD, and microSD. Alternatively or in addition, the memory device may be in the form of a flash drive, a universal serial bus (USB) drive, or any other a solid state storage device. Alternatively or in addition, the memory device may include a printed circuit board (PCB) card that comprises non-volatile solid state memory.

The non-volatile solid state memory may be any semiconductor memory that maintains state when power is disconnected from the semiconductor memory. Examples of the non-volatile solid state memory may include non-volatile memory such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of the non-volatile solid state memory may have different configurations. For example, flash memory may be configured in a NAND or a NOR configuration.

The memory device and/or the non-volatile solid state memory may be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the embodiments as described herein and as understood by one of skill in the art.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components may be resident on separate hardware, such as separate removable circuit boards, or share common hardware, such as a same memory and processor for implementing instructions from the memory.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It is intended that the foregoing detailed description be understood as an illustration of selected forms that embodiments may take and not as a definition of all embodiments. Finally, it should be noted that any aspect of any of the embodiments described herein may be used alone or in combination with one another.

While various embodiments have been described, it will be apparent to those of ordinary skill in the art that many more embodiments and implementations are possible. Accordingly, the embodiments described herein are examples, not the only possible embodiments and implementations.

What is claimed is:

1. A non-volatile memory system comprising:
 a random access memory;
 a non-volatile solid state memory comprising a boot block and a code partition;
 a serial non-volatile semiconductor memory in which a last written boot sector identifier is stored; and
 a memory controller configured to:
 read the last written boot sector identifier from the serial non-volatile semiconductor memory;
 find a last written boot sector of the boot block based on the last written boot sector identifier read from the serial non-volatile semiconductor memory;
 find a last written sector of the code partition based on information read from the last written boot sector; and
 load firmware from the last written sector of the code partition into the random access memory, the firmware executable to implement at least a portion of a block storage protocol.

2. The system of claim 1, wherein the serial non-volatile semiconductor memory comprises serial flash memory.

3. The system of claim 1, wherein the last written boot sector is a most recently written sector of the boot block.

4. The system of claim 1, wherein the non-volatile solid state memory includes NAND memory.

5. The system of claim 1, wherein the block storage protocol is SATA or ATA.

6. The system of claim 1, wherein the memory controller is further configured to store the last written boot sector identifier in the serial non-volatile semiconductor memory in response to a power down signal.

7. The system of claim 6, wherein the power down signal indicates the non-volatile memory system is to enter Runtime D3 (RTD3), a state identified by a SATA protocol.

8. A method for booting a non-volatile memory system, the method comprising:
 reading a last written boot sector identifier from a serial non-volatile semiconductor memory;
 finding a last written boot sector of a boot block in a non-volatile solid state memory based on the last written boot sector identifier read from the serial non-volatile semiconductor memory;
 finding a last written sector of a code partition of the non-volatile solid state memory based on information read from the last written boot sector; and
 executing firmware stored in the last written sector of the code partition, the firmware executable to enable communication between the non-volatile memory system and a host.

9. The method of claim 8, wherein finding the last written boot sector of the boot block comprises searching the boot block for the last written boot sector if a sector identified by the last written boot sector identifier is determined not to be the last written boot sector.

10. The method of claim 8, wherein finding the last written sector of the code partition comprises reading a last written sector identifier from the last written boot sector, and searching for the last written sector of the code partition if a sector identified by the last written sector identifier is determined not to be the last written sector of the code partition.

11. The method of claim 8 further comprising reading a last written sector identifier from the serial non-volatile semiconductor memory, the last written sector identifier identifies a last written sector of a service partition.

12. The method of claim 11 further comprising finding the last written sector of the service partition based on the last written sector identifier.

13. The method of claim 8 further comprising writing to the serial non-volatile semiconductor memory in response to a power down indication.

14. The method of claim 8 wherein finding the last written boot sector of the boot block based on the last written boot sector identifier comprises performing a static and dynamic search.

15. A computer readable storage medium comprising computer executable instructions, the computer executable instructions executable by a processor, the computer executable instructions comprising:
 instructions executable to read a last written service sector identifier from a serial non-volatile semiconductor memory, the serial non-volatile semiconductor memory and a non-volatile solid state memory included in a storage device;
 instructions executable to find a last written service sector of a service partition of the non-volatile solid state memory based on the last written service sector identifier read from the serial non-volatile semiconductor memory; and
 instructions executable to execute firmware that implements at least a portion of a block storage protocol and reads a block storage protocol interface parameter from the last written service sector.

* * * * *